United States Patent
Yamashita et al.

(10) Patent No.: US 6,783,640 B2
(45) Date of Patent: Aug. 31, 2004

(54) SPUTTERING METHOD AND SPUTTERING APPARATUS

(75) Inventors: Toshihiro Yamashita, Tokyo (JP); Hiroshi Echizen, Tokyo (JP); Yasuyoshi Takai, Tokyo (JP); Hidetoshi Tsuzuki, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/050,787

(22) Filed: Jan. 18, 2002

(65) Prior Publication Data

US 2002/0134670 A1 Sep. 26, 2002

(30) Foreign Application Priority Data

Jan. 23, 2001 (JP) .................................... 2001-013974

(51) Int. Cl.⁷ ............................................. C23C 14/34
(52) U.S. Cl. ............................. 204/192.13; 204/192.15
(58) Field of Search ........................ 204/192.13, 192.15, 204/298.03, 298.28

(56) References Cited

U.S. PATENT DOCUMENTS

| | | | |
|---|---|---|---|
| 4,356,073 A | 10/1982 | McKelvey | 204/192 R |
| 4,422,916 A | 12/1983 | McKelvey | 204/192 R |
| 5,232,507 A | 8/1993 | Ohtoshi et al. | 118/719 |
| 5,360,484 A | 11/1994 | Takai et al. | 118/723 |
| 5,597,623 A | 1/1997 | Takai et al. | 427/575 |
| 6,051,851 A | 4/2000 | Ohmi et al. | 257/185 |
| 6,103,442 A | 8/2000 | Katagiri et al. | 430/127 |
| 6,113,732 A | 9/2000 | Yoshida et al. | 156/345 |
| 6,158,382 A | 12/2000 | Segi et al. | 118/723 |
| 6,223,684 B1 | 5/2001 | Fujioka et al. | 118/723 |
| 6,273,955 B1 | 8/2001 | Yoshino et al. | 118/718 |
| 6,335,281 B1 | 1/2002 | Segi et al. | 438/680 |
| 6,338,872 B1 | 1/2002 | Yoshino et al. | 427/248.1 |

OTHER PUBLICATIONS

English Translation of JP 11–29863.*
S. Schiller, et al. "Progress in the Application of the Plasma Emission Monitor in W b Coating" pp. 124–139.
JP 11–029863 Abstract.

* cited by examiner

*Primary Examiner*—Steven VerSteeg
(74) *Attorney, Agent, or Firm*—Fitzpatrick, Cella, Harper & Scinto

(57) ABSTRACT

In a sputtering method for forming a film on a substrate in a film forming space while monitoring emission intensity of plasma, the method comprises the steps of detecting a thickness of the film formed on the substrate; comparing a detected value with a preset value of the film thickness; and deciding a target value of the emission intensity in accordance with a compared result. With the method, a transparent conductive film is formed which has high uniformity in film thickness, sheet resistance and transmittance and hence has superior characteristics.

7 Claims, 9 Drawing Sheets

CONVERSION EFFICIENCY CHANGE RESULTING BY INVENTIVE METHOD

CORRELATION BETWEEN TARGET VALUE AND CONVERSION EFFICIENCY

CORRELATION BETWEEN TARGET VALUE AND Rs

SPUTTERING METHOD AND SPUTTERING APPARATUS

BACKGROUND OF THE INVENTION

1. Field of the Invention

The present invention relates to a sputtering method and a sputtering apparatus, which are implemented while monitoring the emission intensity of plasma. The present invention develops a superior effect particularly when forming a deposit film, such as a transparent conductive film, by a reactive sputtering process.

2. Description of the Related Art

In general, two methods are proposed for producing a transparent conductive film made of a metal oxide on a substrate by a sputtering process, i.e., one in which an oxide, such as $In_2O_3$—$SnO_2$, is employed as a target and is subjected to sputtering in an Ar gas, and the other (reactive sputtering process) in which an alloy, such as In—Sn, is subjected to sputtering in a gas mixture of an inert gas, such as Ar, and $O_2$.

The former method is able to produce a film having low electrical resistance and high transmittance by sputtering, but has difficulty in increasing a film forming rate.

On the other hand, the latter reactive sputtering process is able to increase a film forming rate. It is reported that, particularly in a DC magnetron sputtering apparatus using a cylindrical rotating target disclosed in U.S. Pat. No. 4,356,073 and U.S. Pat. No. 4,422,916, the efficiency in utilization of a target material is about 2.5 to 3 times as large as that obtainable with a conventional planar type apparatus ("Functional Materials", Mar., 1991, Vol. 11, No. 3, pp. 35–41).

The reactive sputtering process using the rotating target has advantages in that a target material can be saved and a production down time due to target replacement can be greatly reduced.

The DC magnetron sputtering apparatus using the rotating target is therefore suitable for mass-production.

In the reactive sputtering process, however, a film forming condition, in particular, a gas flow rate, has a very narrow suitable range, and hence a difficulty occurs in control of film forming parameters, e.g., uniformity in sheet resistance and transmittance, discharge stability and so on, when a transparent conductive film is formed on, e.g., a sheet-like substrate having a large area.

As an improvement for overcoming the problem mentioned above, there is known a reactive sputtering process employing a plasma emission monitor (abbreviated as "PEM" hereinafter) (S. Schiller, U. Heisig, Chr. Komdorfer, J. Strumpfel, and V. Kirchhoff, "Progress in the Application of the Plasma Emission Monitor in Web Coating", Proceedings of the $2^{nd}$ International Conference on Vacuum Web Coating, Fort Lauderdale, Fla., USA October 1988).

The PEM is a device for collecting plasma emissions by a collimator, introducing the emissions to a photomultiplier through a spectroscope, and monitoring a plasma state with an electrical signal obtained through photoelectric conversion of the emissions by the photomultiplier. In a sputtering apparatus employing a PEM, the function of adjusting the flow rate of an introduced reactive gas and holding the emission intensity of plasma constant can be developed with the sensitivity of the photomultiplier of the PEM set to a certain value.

Also, Japanese Patent Laid-Open No. 11-29863 discloses a technique for forming an ITO (Indium Tin Oxide) film on a substrate. A gist of the disclosed technique is as follows. A substrate is set in a film forming chamber, and a discharge is generated in the film forming chamber under a condition in which a sputtering gas is introduced, but a reactive gas is not introduced to the chamber. The sensitivity of a device for monitoring the emission intensity of discharge plasma is adjusted and the amount of the introduced reactive gas is controlled so that the plasma emission intensity is adjusted at a predetermined value. Then, a target is subjected to sputtering while a set value of the emission intensity is varied so as to hold the actual emission intensity of plasma constant at all times. As a result, a deposition rate is held constant.

In other words, according to the disclosed technique, when forming an ITO film, a deposition rate in the formation of the film is held constant by adjusting the flow rate of an introduced reactive gas ($O_2$) so that the actual-emission intensity of In plasma (wavelength=451.1 nm) is held constant.

With the techniques described above, it has become possible to produce a fairly satisfactory deposit film at a certain level of stability using the reactive sputtering process.

However, when continuously forming a deposition film of superior characteristics at a high film forming rate for a long time, the following problems still remain not yet overcome.

With recent progress of the technology, levels of characteristics and uniformity required for a deposit film have increased year by year. Correspondingly, severer criteria than those ones, which have been employed so far, are applied for determination of characteristics and uniformity. Also, from the viewpoint of cost effectiveness, a deposit film forming method and apparatus with higher productivity is demanded.

Under such a situation, when the above-described conventional reactive sputtering process combined with the PEM is employed to form a transparent conductive film on a substrate for a long time using an In—Sn alloy target, the film forming rate changes over time, whereupon uniformity in sheet resistance and transmittance deteriorates despite of the PEM control. This may result in that the formed film does not satisfy the criteria required as a product (or the yield reduces).

In particular, when sputtering is performed for a long time using a metal having a low melting point, such as In, the surface shape (e.g., asperities) and the surface condition (e.g., partial melting of an outermost surface) of a target change over time. Eventually, even though the emission intensity is controlled by the PEM so as to fall within a certain range, it is often inevitable that the film thickness, the sheet resistance and the transmittance become not uniform.

Those problems are more critical particularly when forming a deposit film for a long time using a long-strip substrate as practiced by the so-called roll-to-roll method, or when increasing, e.g., the applied power and/or the flow rate of an introduced gas during sputtering to increase a deposit film forming rate, because the surface shape and the surface condition of a target are changed to a larger extent in a short time.

SUMMARY OF THE INVENTION

It is one object of the present invention to provide a sputtering method and a sputtering apparatus, which can hold constant the sheet resistance and the transmittance of a deposit film (particularly a transparent conductive film), and which can easily control a film forming rate to be kept constant. The sputtering method and apparatus of the present invention is particularly suitable for use in the case of performing reactive sputtering with a target using a metal having a low melting point, such as an In—Sn alloy.

Another object of the present invention is to provide a sputtering method and a sputtering apparatus, which can form a deposit film having high uniformity in film thickness, sheet resistance and transmittance and having superior characteristics, particularly even in the case of forming a deposit film (especially a transparent conductive film) for a long time using an long-strip substrate or increasing a deposit film forming rate.

As a result of conducting intensive studies on a reactive sputtering process with a DC magnetron sputtering apparatus using a cylindrical rotating target while attention is especially focused on the surface condition, the sputtering rate and the surface reaction of the target, the inventors have accomplished the present invention having features as follows.

According to one aspect of the present invention, there is provided a sputtering method for forming a film on a substrate in a film forming space while monitoring emission intensity of plasma, the method comprising the steps of detecting a thickness of the film formed on the substrate; comparing a detected value with a preset value of the film thickness; and deciding a target value of the emission intensity in accordance with a compared result.

In the sputtering method of the present invention, preferably, a flow rate of at least one of gases introduced to the film forming space is controlled such that actual emission intensity is adjusted at the target value of the emission intensity.

The target value of the emission intensity is preferably set to fall in a predetermined range defined beforehand. Furthermore, preferably, if the target value deviates from the predetermined range, sputtering is stopped.

In the sputtering method of the present invention, a target containing In may be employed as a sputtering target. Also, a cylindrical rotating target is preferably employed as a sputtering target.

In the sputtering method of the present invention, preferably, an oxygen gas is selected as one of the gases, of which flow rate is controlled.

According to another aspect of the present invention, there is provided a sputtering apparatus comprising a film forming container, a substrate feeding mechanism, and an emission intensity monitor, the apparatus further comprising a film thickness measuring device for measuring a thickness of a film formed on a substrate and outputting a measured result; and a comparator for comparing an output of the film thickness measuring device with a preset value of the film thickness and outputting a target value of the emission intensity monitor in accordance with a compared result.

Preferably, the sputtering apparatus of the present invention further comprises a gas flow rate control mechanism for receiving the target value of the emission intensity monitor and controlling a flow rate of at least one of gases introduced to the film forming container in accordance with the target value.

Further objects, features and advantages of the present invention will become apparent from the following description of the preferred embodiments with reference to the attached drawings.

DESCRIPTION OF THE PREFERRED EMBODIMENTS

The present invention will be described below in detail, by way of example, in connection with a preferred embodiment. In the preferred embodiment, a long stainless steel plate is employed as a substrate, and a photoelectric conversion layer (semiconductor layer of the NIP structure) is formed on the substrate. On the photoelectric conversion layer, an ITO film is formed, as a transparent conductive film defining an outermost layer of a photovoltatic device, by the so-called roll-to-roll method using, as a target, a rotating target made of an In—Sn alloy that is a metal having a low melting point. Note that the following description should not be construed as limiting the material and shape of the substrate, the kind of a device, etc., to which the present invention is applicable.

It has been found that, in reactive sputtering using an In—Sn alloy target, a film forming rate is reduced as the flow rate of a reactive gas ($O_2$) increases, and film quality is improved correspondingly (Haruhiro Kobayashi, "Sputtered Thin Film (Fundamentals and Applications)", The Japan Industrial Journal, 1993).

Figure 19:
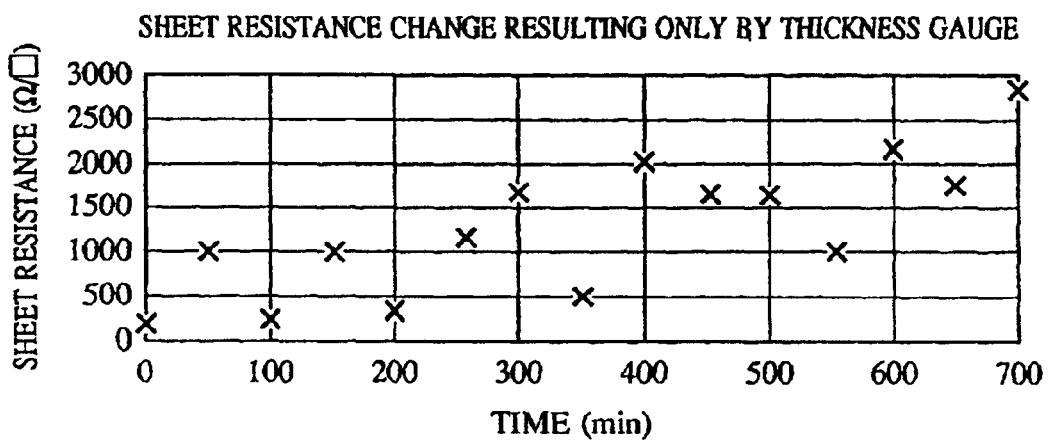
FIG. 19 is a graph showing a sheet resistance change resulting when a transparent conductive film is formed for 700 minutes under control only by a thickness gauge as a comparative example 1.

With a simple increase in the flow rate of the reactive gas, however, the sheet resistance is not stable and is relatively high, as shown in FIG. 19 (described later). The reason is that a portion (so-called nodule) of a rotating target surface, in which oxidation has progressed, and an alloy layer, in which oxidation has not yet occurred, appear in a plasma area by turns periodically.

To be adapted for a periodical change in surface condition of the rotating target, therefore, a PEM is essential which is able to momentarily control the flow rate of the reactive gas depending on the surface condition.

Figure 22:
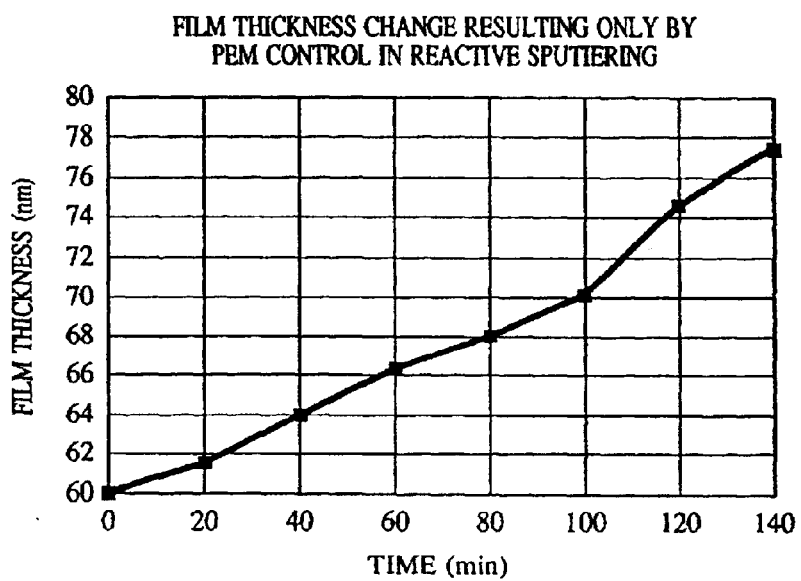
FIG. 22 is a graph showing a film thickness change resulting when a transparent conductive film is formed by a reactive sputtering process under control of an $O_2$ flow rate only by a PEM as a comparative example 2.

However, even though a target value of the plasma emission intensity is held constant using the PEM, the film thickness formed per unit time is significantly increased m, over time, as shown in FIG. 22, particularly when the target material is a metal having a low melting point (In—Sn in this embodiment).

Such an increase of the film thickness leads to a disadvantage that, in spite of performing the PEM control, in uniformity in sheet resistance and transmittance of a formed deposit film is deteriorated.

That phenomenon is presumably based on the fact that the state of a target under sputtering (typically a sputtering rate) and a manner of reaction thereof with oxygen are varied due to changes in the surface shape (e.g., asperities) and the surface condition (e.g., partial melting of an outermost surface) of the target.

In the preferred embodiment of the present invention, therefore, the following two kinds of control are carried out during the film formation. First one is short-time control (momentary control of oxygen amount) in which the flow rate of the reactive gas is adjusted moment to moment by a piezo-type valve, for example, so that the plasma emission intensity detected by the PEM is held to be matched with a target value. The sheet resistance and the transmittance of a formed film are thereby controlled. In second kind of control, the sputtering condition, which gradually changes over time due to a change in, e.g., surface condition of the target, is determined based on a change in film thickness, and the target value of the plasma emission intensity under the PEM control is adjusted in accordance with a determined result. More specifically, a detected value of the film thickness is compared with a preset value of the film thickness, and the target value of the plasma emission intensity under the PEM control is varied or maintained in accordance with a compared result. In this respect, an essential point is that while it has been conventional to hold the actual emission intensity constant by varying the target value of the plasma emission intensity, the actual emission intensity is changed in the preferred embodiment of the present invention.

Furthermore, preferably, the target value of the plasma emission intensity is controlled so as to fall within a predetermined width that has been determined based on an experiment beforehand, and the flow rate of the reactive gas ($O_2$) is momentarily adjusted under the PEM control. This enables the piezo-type valve to function under the PEM control such that the sputtering condition is sufficiently adapted for the above-described periodic change in surface condition of the rotating target. As a result, uniformity in the film thickness, sheet resistance and transmittance can be held within respective target ranges. If the decided target value of the plasma emission intensity deviates from the predetermined width upon a change in the film thickness, this means that any anomaly has occurred in the apparatus. In such an event, therefore, it is preferable to stop the film forming operation and check the apparatus.

The sputtering method and apparatus of the present invention will now be described in more detail.

The apparatus configuration is featured in adding a (film) thickness gauge and a plasma emission monitor (PEM) to a sputtering apparatus.

The thickness gauge may be of the type optically. detecting a film thickness, detecting a film thickness by applying a vibration, or physically detecting a film thickness. Among them, an optical detector for illuminating light to a substrate and computing a film thickness from the light reflected by the substrate is suitably employed.

A comparator is connected to the thickness gauge. Inputted to the comparator are an output (detected result) of the thickness gauge and a target value of the film thickness set beforehand. The comparator compares the output value of the thickness gauge with the target value of the film thickness, and outputs a compared result to an emission intensity target-value setting unit.

The emission intensity target-value setting unit sets a target value of the emission intensity in accordance with the compared result. For example, when the output value of the thickness gauge is greater than the target value of the film thickness, the target value of the emission intensity is set to a value smaller than that having been set so far. Conversely, when the output value of the thickness gauge is smaller than the target value of the film thickness, the target value of the emission intensity is set to a value greater than that having been set so far.

Also, the PEM includes a comparator for comparing the plasma emission intensity detected by a photomultiplier with the target value of the emission intensity, and then outputting a compared result.

In this embodiment, since the roll-to-roll method is employed and the substrate is always fed during the film formation, a position of the substrate, at which the film thickness is measured, is also always moved even with the thickness gauge maintained at a fixed position. Accordingly, if the feed speed is constant, the detected film thickness represents an amount by which the film is formed per unit time (i.e., film forming rate). In that case, the film thickness measured by the thickness gauge is proportional to the film forming rate. When a position of the substrate, at which the film thickness is measured, is fixed (i.e., when a film is formed without feeding the substrate), it is preferable to compute a film forming rate from the amount of change in the measured film thickness, to compare the computed film forming rate with a preset value of the film forming rate, and to adjust the target value of the emission intensity in accordance with a compared result.

More preferably, the apparatus is designed to be able to automatically carry out setting and control, which are required in a series of processing steps described above, by using a computer.

Furthermore, the target value of the emission intensity is preferably decided using the PEM by previously confirming an actual amount by which the target value of the emission intensity should be increased or decreased corresponding to a difference between the detected value and the target value.

In the method of the present invention described above, it is important that a proper range of the target value of the emission intensity be confirmed beforehand, by way of example, as follows.

(Example for Confirming Proper Set Range of Target Value of Emission Intensity)

To obtain the film thickness, the sheet resistance and the transmittance at constant values by varying the flow rate of the reactive gas ($O_2$) depending on a change in the film forming rate, the target value for all parameters must be set to fall within the predetermined range as mentioned above. One example of the practical setting method is described below.

The following description is made by taking an amorphous silicon solar cell as an example, but the present invention is in no way limited by the following description. The method and apparatus of the present invention are also applicable to methods and apparatuses for manufacturing any other types of devices having transparent conductive films.

Correlation between each parameter and the target value was confirmed by employing an apparatus that is the same as a roll-to-roll sputtering apparatus used in Example 1 described later, and forming a transparent electrode on the light incident side of the amorphous silicon solar cell at each discrete target value while varying the target value of the emission intensity over a particular range (80 to 320 in this example).

Figure 12:
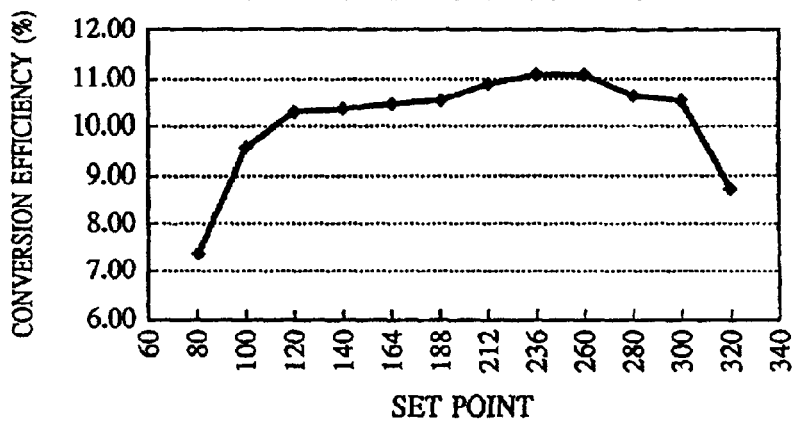
FIG. 12 is a graph showing correlation between a set point and conversion efficiency resulting from an experiment for confirming a predetermined range of the set point in which a stable value of the conversion efficiency is obtained.
Figure 13:
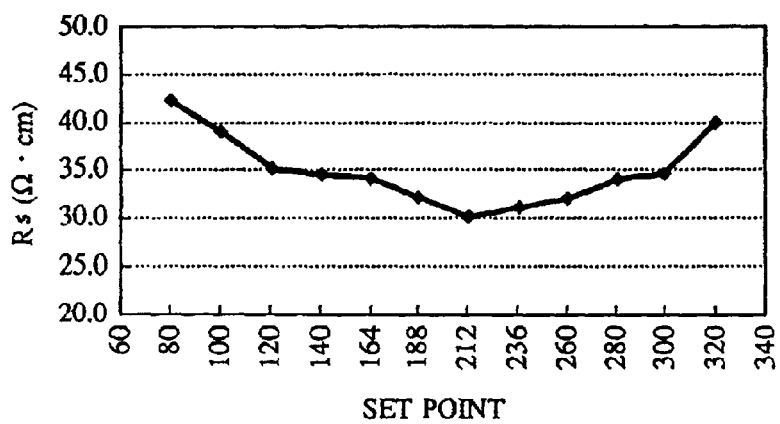
FIG. 13 is a graph showing correlation between a set point and Rs (series resistance) resulting from an experiment for confirming a predetermined range of the set point in which a stable value of the Rs is obtained.
Figure 14:
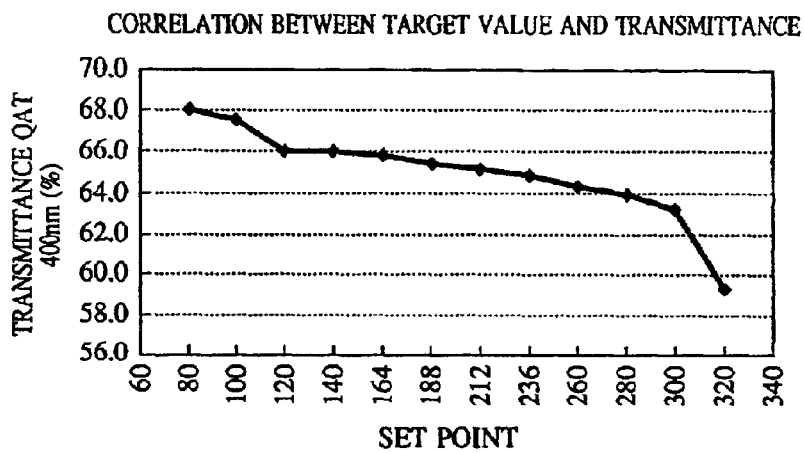
FIG. 14 is a graph showing correlation between a set point and transmittance resulting from an experiment for confirming a predetermined range of the set point in which a stable value of the transmittance is obtained.
Figure 15:
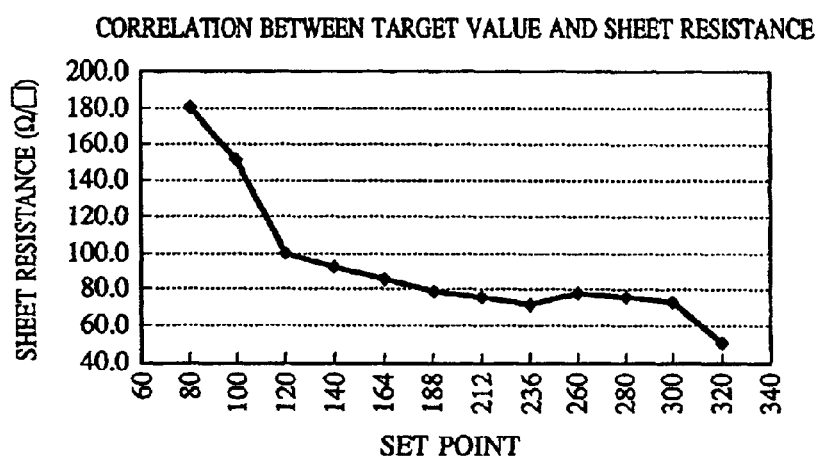
FIG. 15 is a graph showing correlation between a set point and sheet resistance resulting from an experiment for confirming a predetermined range of the set point in which a stable value of the sheet resistance is obtained.
Figure 16:
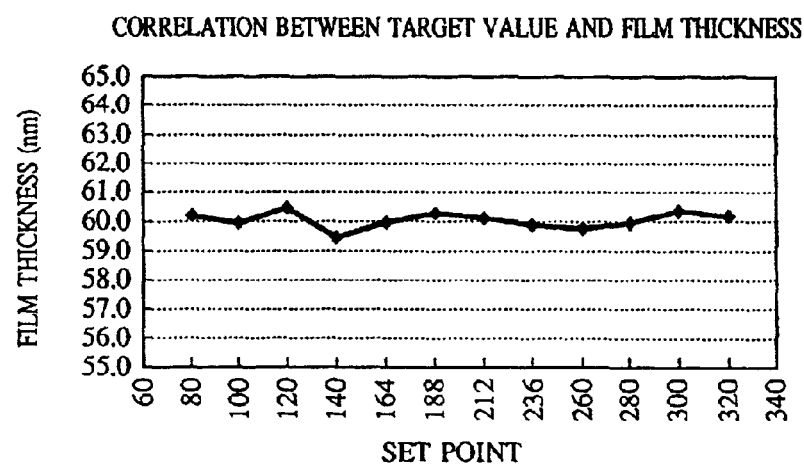
FIG. 16 is a graph showing correlation between a set point and a film thickness resulting from an experiment for confirming a predetermined range of the set point in which a stable value of the film thickness is obtained.

Confirmed results are plotted in FIGS. 12 to 16. FIG. 12 shows correlation between the target value (set point) and conversion efficiency; FIG. 13 shows correlation between the target value and Rs (series resistance); FIG. 14 shows correlation between the target value and transmittance (Q value at 400 nm); FIG. 15 shows correlation between the target value and sheet resistance; and FIG. 16 shows correlation between the target value and a film thickness.

As seen from the correlation between the target value and each of the parameters shown in FIGS. 12 to 16, a proper range of the target value, in which all parameters have stable values, is from 120 to 300. However, that proper range should not be regarded as being absolute one, but differs depending on the type of the PEM employed in practice. In other words, an optimum set range of the target value (i.e., range in which the target value is variably set) must be set depending on a desired system of a deposit film forming apparatus and desired control values of respective parameters.

By determining the set range of the target value in such a manner, stable characteristics of the solar cells can be obtained.

EXAMPLE 1

Although this Example 1 is described below in connection with a roll-to-roll sputtering apparatus in which a reactive sputtering process is performed using a rotating target, the concept of this Example can be similarly applied to any sputtering apparatus provided with a PEM regardless of the kind of process and the type of apparatus.

(Roll-to-Roll Sputtering Apparatus)

Figure 1:
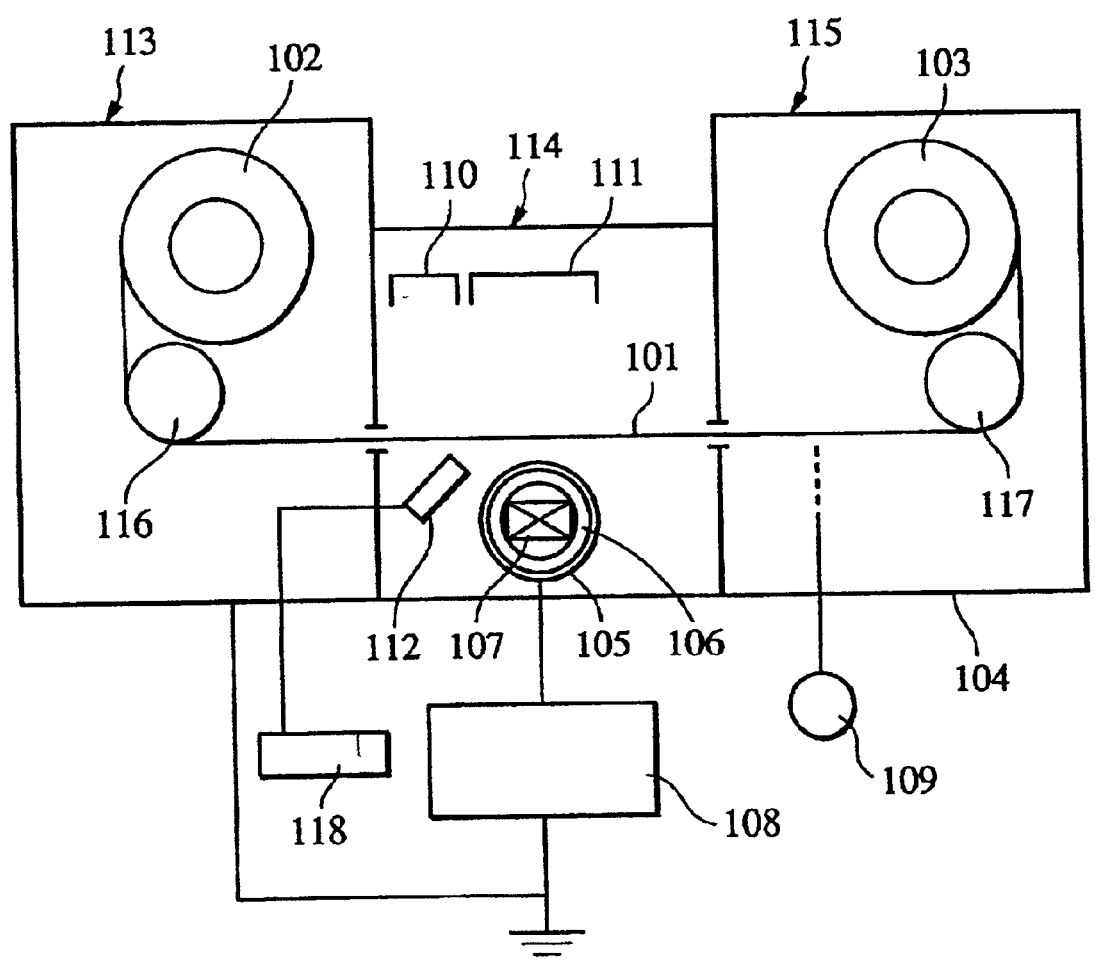
FIG. 1 is a schematic sectional view showing one example of an apparatus for forming a transparent conductive film by sputtering according to the present invention.

FIG. 1 is a schematic sectional view of a DC magnetron reactive sputtering apparatus using a cylindrical rotating target according to this Example.

Referring to FIG. 1, a vacuum chamber 104 is constituted by a substrate letting-out chamber 113, a film forming chamber 114, and a substrate winding-up chamber 115. These chambers can be individually evacuated by respective vacuum pumps (not shown). A long-strip substrate 101 is wound around a substrate letting-out roll 102, and is fed in a direction from the left toward the right, as viewed in FIG. 1, by a feed means (not shown) through a substrate feeding roller 116. Then, the substrate 101 is reeled up around a substrate winding-up roll 103 through a steering roller 117 while windup unevenness in the width direction of the substrate 101 is remedied by a mechanism of the steering roller 117.

A cathode 106 has a cylindrical shape, and a target 105 is attached to a circumferential surface of the cathode 106 by bonding. A magnet 107 and a cooling means (not shown) are provided inside the cathode 106. A DC power supply 108 is connected to the vacuum chamber 104 such that the vacuum chamber 104 serves as an anode. Thus, electric power is applied between the cathode 106 and the vacuum chamber 104. The long-strip substrate 101 is held in a floating state (i.e., state insulated from the vacuum chamber 104).

Heaters 110 and 111 in the form of sheath-heaters are provided in the film forming chamber 114. The heater 110 is arranged slightly offset to the left (in a direction toward the substrate letting-out roll 102) with respect to the cathode 106, and the heater 111 is arranged just above the cathode 106. The heater 110 has an electrical capacity greater than the heater 111. In a region just under the heater 111, particularly, the long-strip substrate 101 is subjected to heat of the heater introduced from above and heat of plasma introduced from below. A temperature at the rear side (upper surface in FIG. 1) of the long-strip substrate 101 is measured by a thermocouple disposed in contact with the substrate rear side. Then, electric power supplied to the heaters 110, 111 is controlled so that the temperature at the substrate rear side is kept constant. Further, a collimator 112 is provided in the film forming chamber 114 and connected to a PEM 118, which is provided outside the film forming chamber 114. The substrate winding-up chamber 115 is provided with a thickness gauge 109 constituted as an optical interference thickness gauge.

The apparatus thus constructed may be operated in an automatic or manual manner. In any case, an interlock mechanism is preferably attached for the sake of safety.

The above-described apparatus is operated in accordance with the following steps.

First, the substrate letting-out roll 102, around which the long-strip substrate 101 is wound, is set in the substrate letting-out chamber 113. Then, the long-strip substrate 101 is routed so as to pass the substrate letting-out chamber 113, the film forming chamber 114 and the substrate winding-up chamber 115 in that order. After fixing a leading end of the long-strip substrate 101 to the substrate winding-up roll 103, the substrate winding-up roll 103 is rotated several times. Subsequently, a tension is applied to the long-strip substrate 101 by a tension generating mechanism (not shown).

When the long-strip substrate 101 is a conductive substrate and must be kept in an electrically insulated state like this Example, the insulated state of the long-strip substrate 101 is confirmed on that occasion (i.e., at the timing immediately after applying a tension).

Next, the film forming chamber 114 is evacuated by a vacuum pump (not shown) to a vacuum degree on the order of $10^{-3}$ Pa. Then, an Ar gas is introduced and the vacuum level is adjusted to 0.3 Pa. Outputs of the heaters 110 and 111 are controlled. More specifically, electric power is supplied to the heaters 110 and 111, and outputs of the heaters 110 and 111 are controlled such that the temperature at the rear side of the long-strip substrate 101 is 215° C. in an area opposing to the heater 110 and 200° C. in an area opposing to the heater 111. After the lapse of one hour from the energization of the heaters 110 and 111, electric power of 1.8 kW is applied to the cathode 106 from the DC power supply 108. After confirming the occurrence of an Ar discharge, an $O_2$ gas is introduced to the film forming chamber 114, and the long-strip substrate 101 starts to be fed at a feed speed of 1.5 m/min. Further, sensitivity of the photomultiplier in the PEM 118 is adjusted in accordance with the method disclosed in Japanese Patent Laid-Open No. 11-29863. The PEM 118 may be, e.g., a plasma emission monitor PEM04 made by ARDENNE ANLAGEN TECHNIK Co.

The sensitivity of the photomultiplier is adjusted by a method of generating a discharge only with an Ar gas and adjusting a gain of the photomultiplier such that the plasma emission intensity is 600. After the adjustment, an $O_2$ gas is introduced to start formation of a film. When an area of the substrate, in which the film has been formed, is fed to a position just above the thickness gauge 109, the target value of the plasma emission intensity is adjusted such that a reading of thickness gauge 109 is held at 60 nm. A transparent conductive film is produced by adjusting the target value of the plasma emission intensity as required.

When the film formation on a predetermined length of the substrate 101 is completed, the $O_2$ gas, the Ar gas, the DC power supply 108, the heater 110, and the heater 111 are all stopped. The feed of the long-strip substrate 101 is also stopped. After cooling the substrate for one hour, the interior of the film forming chamber 114 is restored to the atmospheric pressure, and a product is taken out of the vacuum chamber 104.

(Behavior of Each Parameter in Short Time by Control Process in this Example)

Changes in values of respective parameters measured by carrying out the film formation for a short time will be described with reference to FIGS. 2 to 6. An apparatus used for the measurement was the same as the roll-to-roll sputtering apparatus shown in FIG. 1.

Figure 2:
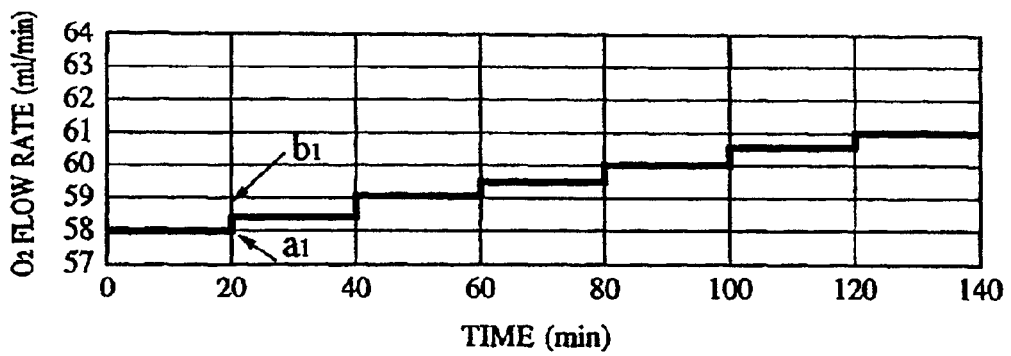
FIG. 2 is a graph showing a gas flow rate change resulting when a transparent conductive film is formed for 140 minutes according to the method of the present invention.
Figure 3:
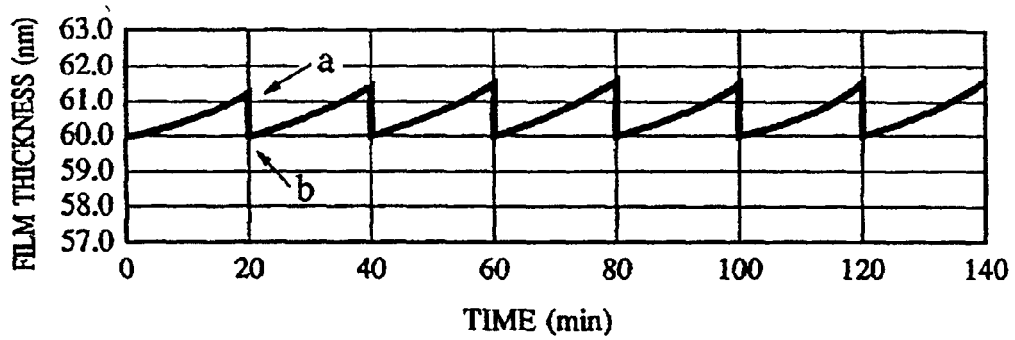
FIG. 3 is a graph showing a film thickness change resulting when a transparent conductive film is formed for 140 minutes according to the method of the present invention.
Figure 4:
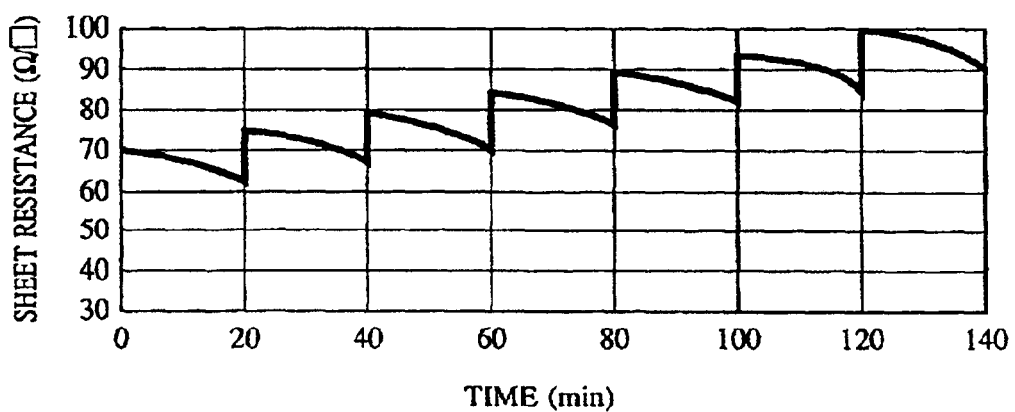
FIG. 4 is a graph showing a sheet resistance change resulting when a transparent conductive film is formed for 140 minutes according to the method of the present invention.
Figure 5:
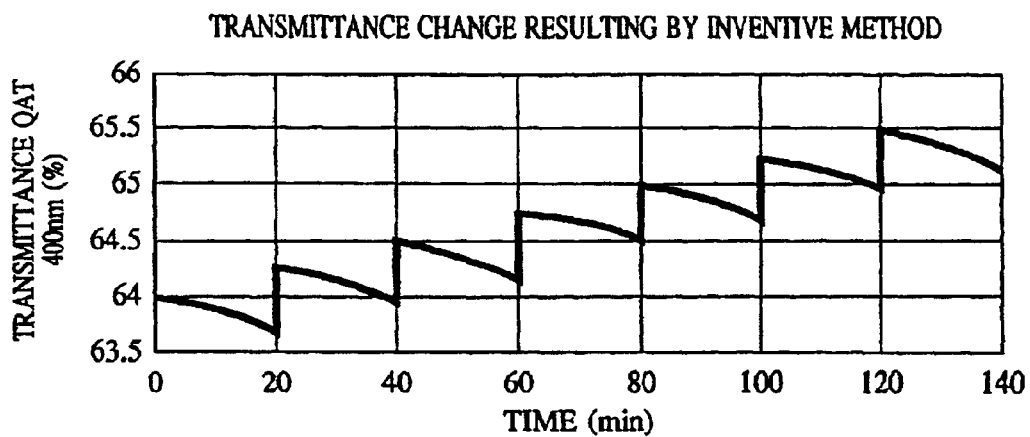
FIG. 5 is a graph showing a change in transmittance Q at 400 nm resulting when a transparent conductive film is formed for 140 minutes according to the method of the present invention.
Figure 6:
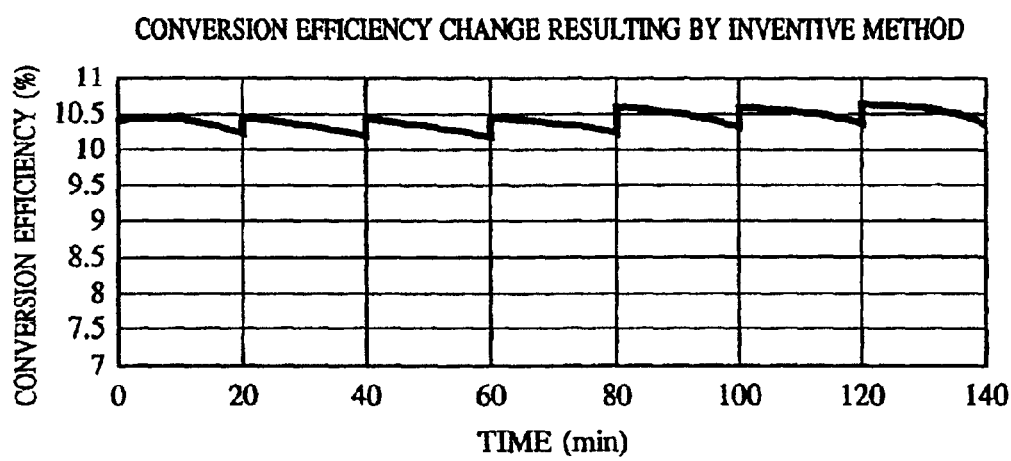
FIG. 6 is a graph showing a change in conversion efficiency of an amorphous silicon solar cell resulting when a transparent conductive film is formed for 140 minutes according to the method of the present invention.

FIG. 2 shows a change in the flow rate of the $O_2$ gas, and FIG. 3 shows a change in the film thickness measured by the thickness gauge 109. FIG. 4 shows a sheet resistance change, and FIG. 5 shows a transmittance change. FIG. 6 shows a change in the conversion efficiency of an amorphous silicon solar cell having the transparent conductive film formed according to this Example.

AS shown in FIG. 3, after the lapse of about 20 minutes from the start of the film formation, the film thickness has a greatly increased value. When the film thickness increases by 1 nm from a predetermined value of 60 nm (i.e., at a point a in FIG. 3), the flow-rate of the $O_2$ gas is increased by 0.5 ml/min from a point a1 to b1 as shown in FIG. 2. With such an adjustment, the film thickness is returned to a point b shown in FIG. 3.

FIGS. 2 to 6 show results obtained by performing that adjustment periodically.

More specifically, by carrying out the control process described above, the film thickness can be held substantially constant as seen from FIG. 3.

Also, as seen from FIG. 4, the sheet resistance has a tendency to gradually increase as a whole. Looking at a change in more detail, the sheet resistance is slightly reduced contrary to an increase of the film thickness, and is increased in proportion to an increase of the flow rate of the $O_2$ gas.

As seen from FIG. 5, the transmittance also has a tendency to gradually increase as a whole. Looking at a change in more detail, the transmittance is slightly reduced contrary to an increase of the film thickness, and is increased in proportion to an increase of the flow rate of the $O_2$ gas.

Further, as seen from FIG. 6, the conversion efficiency of the solar cell has characteristics held substantially constant. The reason why the substantially constant conversion efficiency of the solar cell is obtained is that, by increasing the flow rate of the $O_2$ gas to suppress an increase of the film forming rate, the sheet resistance is increased as shown in FIG. 4, thus tending to reduce the conversion efficiency, but at the same time the transmittance is increased as shown in FIG. 5 to compensate for a reduction of the conversion efficiency.

(Behavior of Each Parameter in Long Time by Control Process in this Example)

Changes in values of respective parameters measured by carrying out the film formation for a long time will be described with reference to FIGS. 7 to 11. An apparatus used for the measurement was the same as the roll-to-roll sputtering apparatus shown in FIG. 1.

Figure 7:
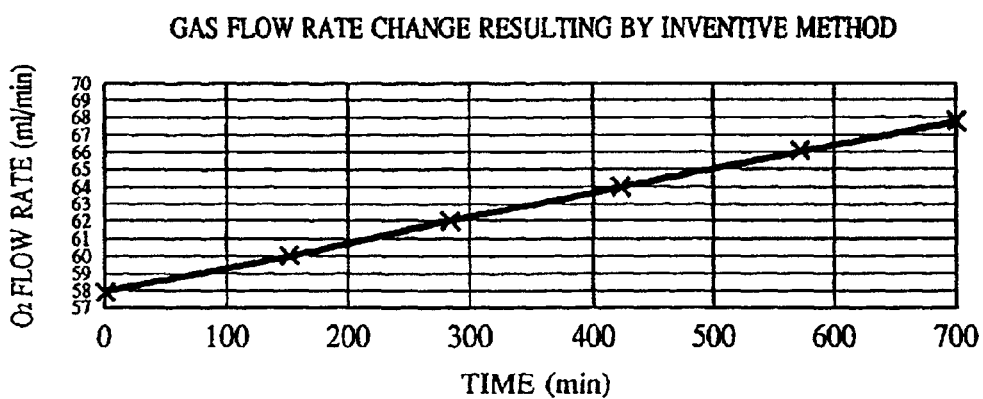
FIG. 7 is a graph showing a gas flow rate change resulting when a transparent conductive film is formed for 700 minutes according to the method of the present invention.
Figure 8:
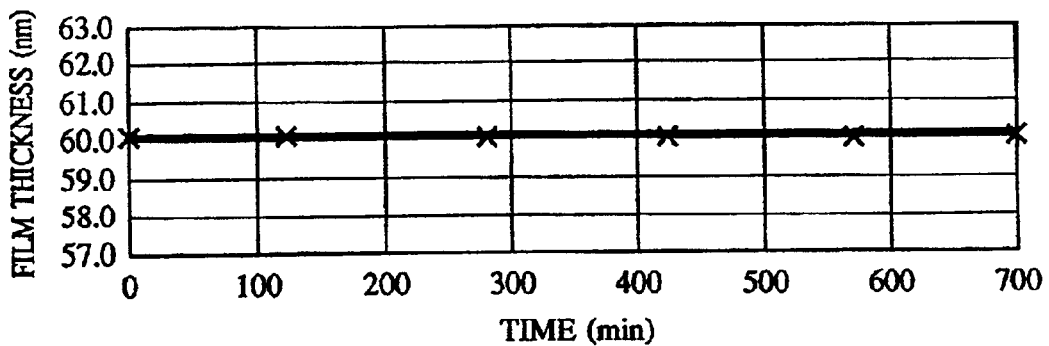
FIG. 8 is a graph showing a film thickness change resulting when a transparent conductive film is formed for 700 minutes according to the method of the present invention.
Figure 9:
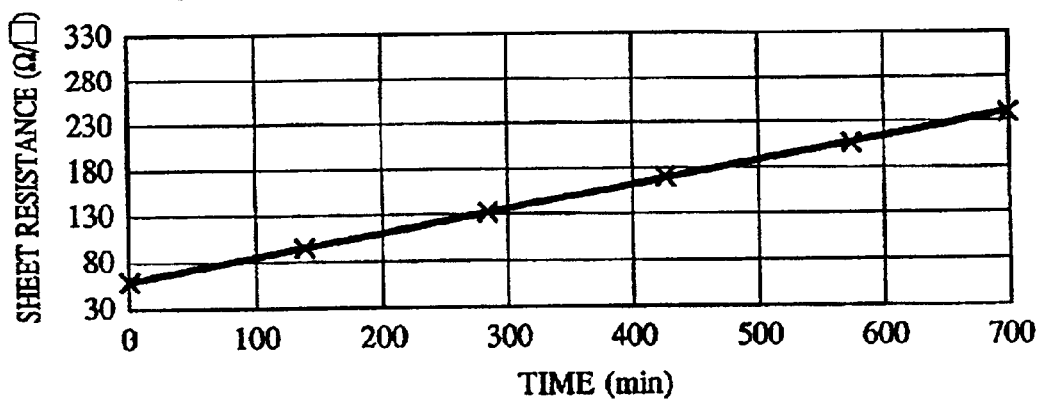
FIG. 9 is a graph showing a sheet resistance change resulting when a transparent conductive film is formed for 700 minutes according to the method of the present invention.
Figure 10:
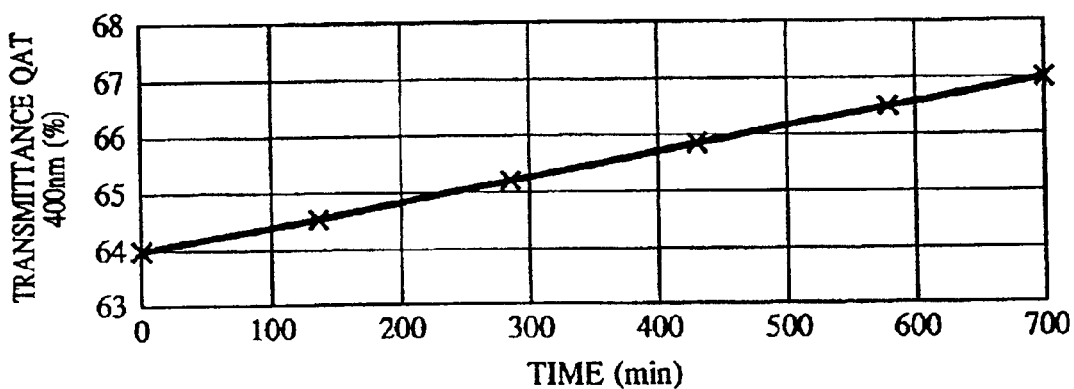
FIG. 10 is a graph showing a change in transmittance Q at 400 nm resulting when a transparent conductive film is formed for 700 minutes according to the method of the present invention.
Figure 11:
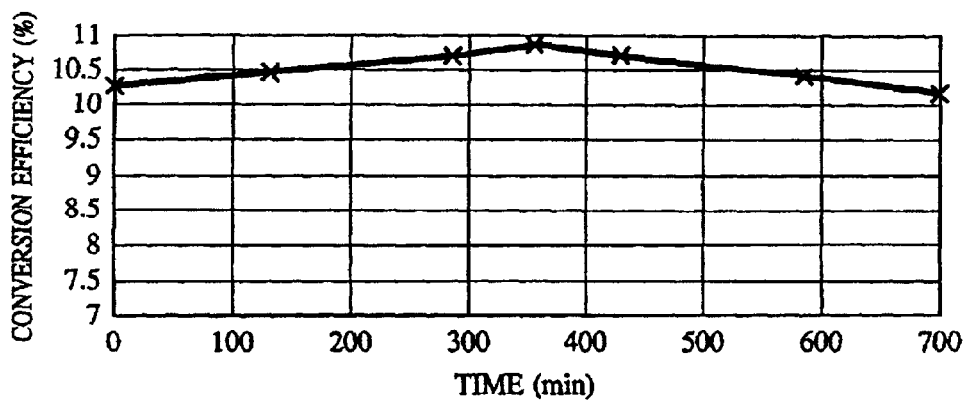
FIG. 11 is a graph showing a change in conversion efficiency of an amorphous silicon solar cell resulting when a transparent conductive film is formed for 700 minutes according to the method of the present invention.

FIG. 7 shows a change in the flow rate of the $O_2$, gas, and FIG. 8 shows a change in the film thickness measured by the thickness gauge 109. FIG. 9 shows a sheet resistance change, and FIG. 10 shows a transmittance change. FIG. 11 shows a change in the conversion efficiency of an amorphous silicon solar cell having the transparent conductive film formed according to this Example.

As with the short-time experiment described above, the flow rate of the $O_2$ gas is increased (FIG. 7) to hold the film thickness constant as shown in FIG. 8. The sheet resistance is also increased correspondingly (FIG. 9). However, because the transmittance is gradually increased (FIG. 10), the conversion efficiency after the film formation for a long time can be held in a satisfactory range of 10.4 to 10.8% (FIG. 11).

EXAMPLE 2

In this Example 2, experiments were conducted to confirm sheet resistance per unit area resulting by changing electric power applied to a target in each of a conventional method only using the PEM control and the sputtering method of the present invention. Obtained results are plotted in FIG. 23.

Figure 23:
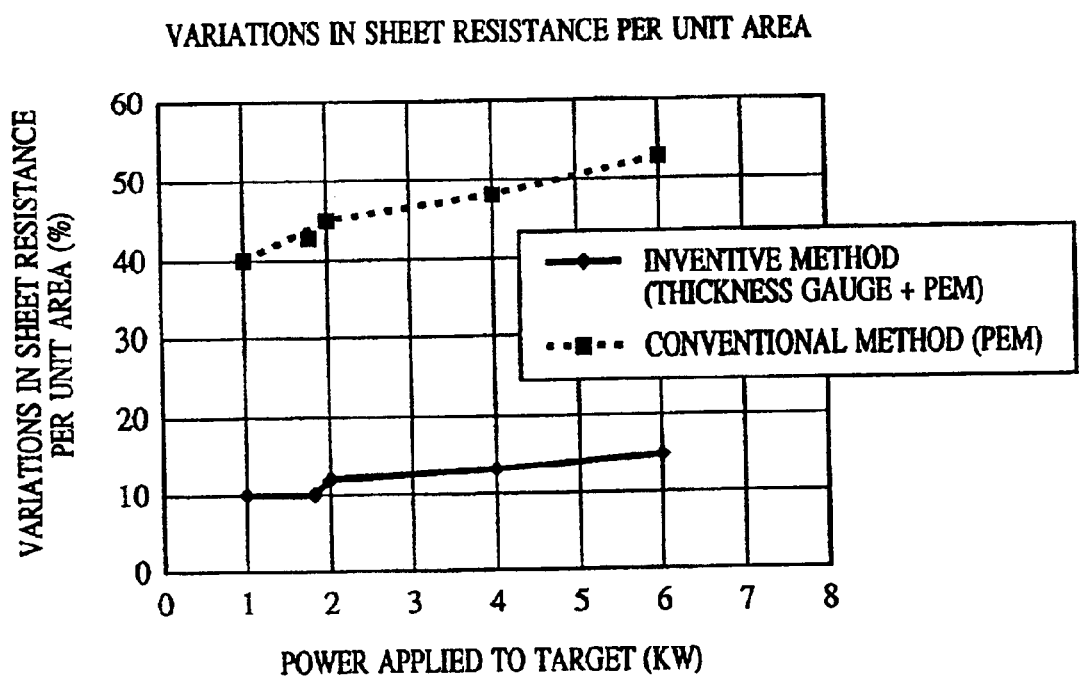
FIG. 23 is a graph showing variations in sheet resistance per unit area of transparent conductive films formed by the method of the present invention and a conventional method.

As seen from FIG. 23, the sheet resistance per unit area varies in a range of about 40% to 53% with the conventional control method in which the $O_2$ flow rate is changed while monitoring plasma by the PEM.

With the method of the present invention, however, the sheet resistance per unit area varies in a smaller range of 10% to 15% and is held substantially uniform.

In other words, by carrying out the method of the present invention, a film can be formed with substantially uniform sheet resistance per unit area. Further, since that effect is obtained even at higher film forming rates, the production capability can be increased.

The following is a description on results of long-time film formation by the reactive sputtering process using an In—Sn alloy target according to (1) a production method in which the $O_2$ flow rate was changed while monitoring the film thickness by a thickness gauge (Comparative Example 1) and (2) a production method in which the 2 flow rate was changed while monitoring a PEM (Comparative Example 2).

COMPARATIVE EXAMPLE 1

Figure 17:
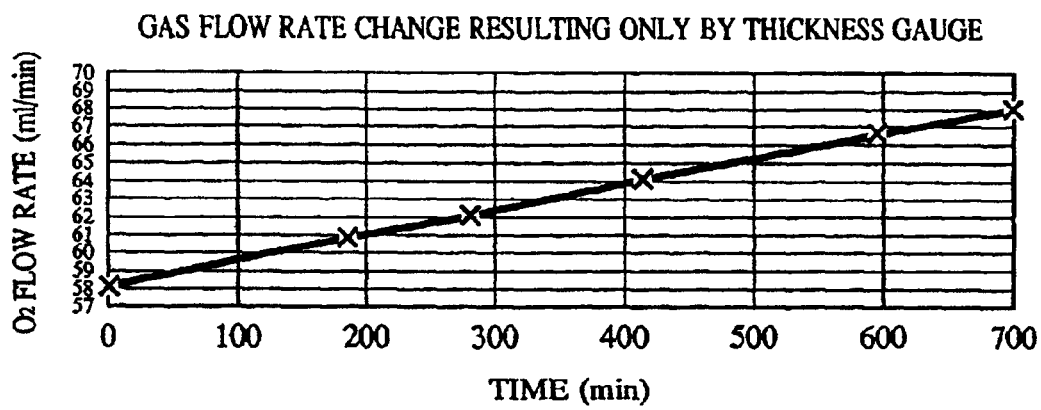
FIG. 17 is a graph showing a gas flow rate change resulting when a transparent conductive film is formed for 700 minutes under control only by a thickness gauge as a comparative example 1.
Figure 18:
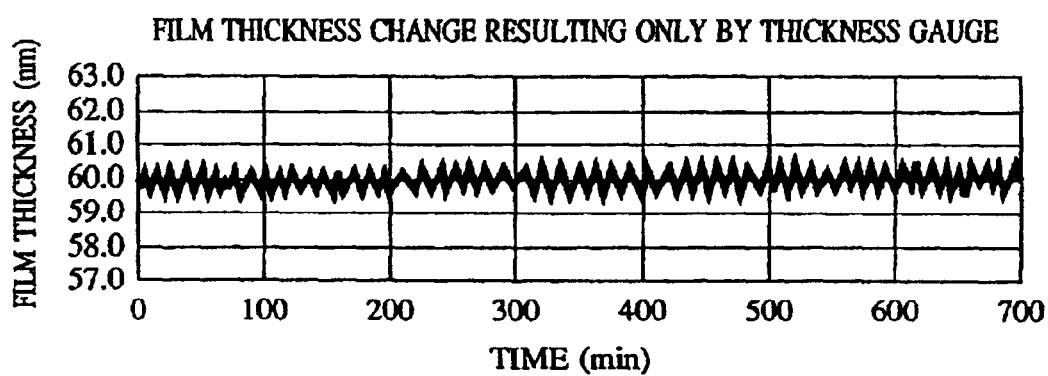
FIG. 18 is a graph showing a film thickness change resulting when a transparent conductive film is formed for 700 minutes under control only by a thickness gauge as a comparative example 1.
Figure 20:
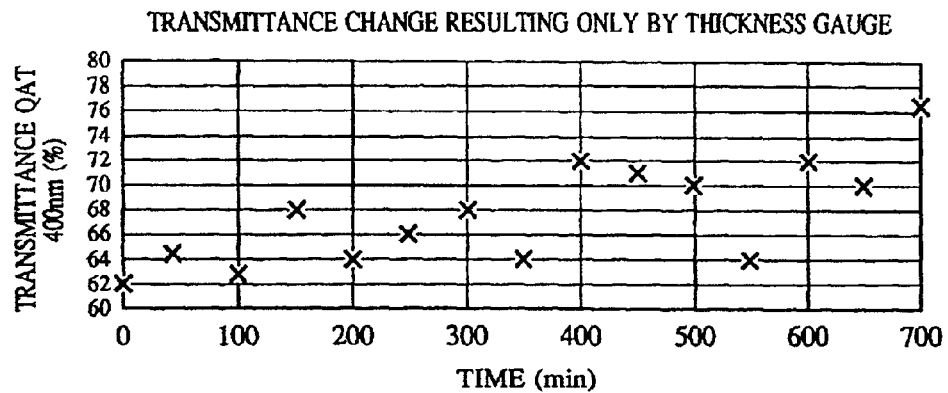
FIG. 20 is a graph showing a change in transmittance Q at 400 nm resulting when a transparent conductive film is formed for 700 minutes under control only by a thickness gauge as a comparative example 1.
Figure 21:
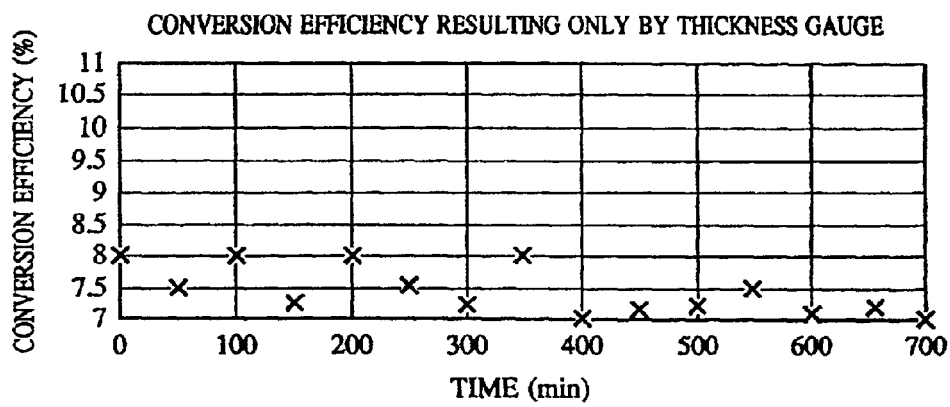
FIG. 21 is a graph showing a change in conversion efficiency of an amorphous silicon solar cell resulting when a transparent conductive film is formed for 700 minutes under control only by a thickness gauge as a comparative example 1.

FIGS. 17 to 21 show experimental results obtained by employing only the thickness gauge without performing the PEM control and introducing a reactive gas directly by a mass flow controller for adjustment of the film thickness. An apparatus used for the experiments was the same as the roll-to-roll sputtering apparatus shown in FIG. 1. FIG. 17 shows a change in the flow rate of the $O_2$ gas, and FIG. 18 shows a change in the film thickness measured by the thickness gauge 109. FIG. 19 shows a sheet resistance change, and FIG. 20 shows a transmittance change. FIG. 21 shows a change in the conversion efficiency of an amorphous silicon solar cell having the transparent conductive film formed according to this Comparative Example.

As shown in FIG. 17, the flow rate of the Qi gas is gradually increased from the start of the film formation. This is because, corresponding to a gradual increase of the film forming rate, the flow rate of the $O_2$ gas was increased to hold the film forming rate constant. Also, the film thickness shown in FIG. 18 was held constant as a result of adjusting the flow rate of the $O_2$ gas.

As seen from the sheet resistance change shown FIG. 19 and the transmittance change shown in FIG. 20, noticeable variations occur in characteristics values of those two parameters. Such a phenomenon is attributable to the fact that, since the PEM control is not performed, the adjustment is not sufficiently adapted for a momentary (short-time) surface change of the target and hence the film forming rate is varied.

Eventually, as shown in FIG. 21, the conversion efficiency of the solar cell changes at relatively low values in a range of 7.3% to 8.0%.

Stated otherwise, it is understood that, in the case of not performing the PEM control, a difficulty is encountered in proper control of the sheet resistance and the transmittance because a minute surface change of the target cannot be adaptively dealt with.

COMPARATIVE EXAMPLE 2

FIG. 22 shows an experimental result obtained by employing only the PEM and changing the flow rate of the $O_2$ gas without monitoring the film thickness by the thickness gauge. The vertical axis of FIG. 22 represents the film thickness indicated on the thickness gauge 109 when a transparent conductive film was formed on the long-strip substrate 101 using the roll-to-roll sputtering apparatus shown in FIG. 1. The long-strip substrate 101 was fed at a feed speed of 1.5 m/min.

As seen from FIG. 22, the film thickness is steeply increased over time. This means a rapid increase of the film forming-rate.

In other words, FIG. 22 indicates the fact that, a transparent conductive film is formed on a substrate for a long time by the reactive sputtering process under the PEM control using an In—Sn alloy target, i.e., a target having a relatively low melting point, the film forming rate is monotonously increased over time. Such a-phenomenon is presumably attributable to changes in both reflectance and surface shape which occur upon generation of nodules (oxides) on the target surface during the film formation for a long time.

It is thus understood that the PEM control enables a momentary (short-time) change in the target surface condition to be properly controlled by monitoring the plasma emission intensity, but it is not adaptable for a change in the film forming rate during the film formation for a long time.

The main differences among Comparative Examples 1, 2 and Example 1 of the present invention are summarized in Table 1 given below.

TABLE 1

| | Production Method | Controllable Parameter |
| --- | --- | --- |
| Example 1 | $O_2$ flow rate is changed under control using both thickness gauge and PEM (control of the invention) | film thickness, sheet resistance, and transmittance |
| Comparative Example 1 | $O_2$ flow rate is changed under control only using thickness gauge (mass flow controller control) | film thickness |
| Comparative Example 2 | $O_2$ flow rate is changed under control only using PEM (piezo-type control) | sheet resistance and transmittance |

According to the preferred embodiment of the present invention, as described above, when a transparent conductive film is formed by the sputtering process, uniformity in film thickness, sheet resistance and transmittance can be greatly increased. In particular, for example, even when the film formation is performed for a long time over 10 hours by the roll-to-roll method using, as a target, a metal having a low melting point such as In, it is possible to hold values of those parameters uniform at all times, and to improve the yield.

Also, even when the deposit film forming rate is increased for an improvement in productivity and the target surface condition is changed to a large extent in a short time, it is similarly possible to hold values of those parameters uniform according to the preferred embodiment of the present invention.

When the present invention is applied to a method of producing a transparent conductive film of a solar cell, the conversion efficiency can be maintained at a high and uniform level over a large area.

Further, in the reactive sputtering process using a rotating target, for which it is generally said very difficult to realize proper control in formation of a film, the film formation can be properly controlled by relatively simple operation.

Consequently, the reactive sputtering method and apparatus according to the preferred embodiment of the present invention can be relatively easily implemented, and uniformity of various characteristics can be maintained while realizing high film forming rates. As secondary effects, the productivity can be improved in such points as saving of the target material and a reduction of production down time necessary for target replacement.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A sputtering method for forming a film on a substrate in a film forming space while monitoring emission intensity of plasma, the method comprising the steps of:

detecting a thickness of the film formed on said substrate;

comparing a detected value with a preset value of the film thickness;

deciding a target value of the emission intensity that will provide the preset value of the film thickness in accordance with a compared result; and adjusting the emission intensity to the target value to increase a transmittance of the film formed on the substrate to compensate for an increase in resistance of the film.

2. The sputtering method according to claim 1, further comprising controlling a flow rate of at least one gas introduced into said film forming space, thereby adjusting the intensity to the target value of the emission intensity.

3. The sputtering method according to claim 2, wherein oxygen gas is selected as the gas for which the flow rate is controlled.

4. The sputtering method according to claim 1, wherein a target containing In is employed as a sputtering target.

5. The sputtering method according to claim 1, wherein a cylindrical rotating target is employed as a sputtering target.

6. The sputtering method according to claim 1, wherein the target value of the emission intensity is set to fall in a predetermined range defined beforehand.

7. The sputtering method according to claim 6, wherein if the target value deviates from said predetermined range, sputtering is stopped.

* * * * *

UNITED STATES PATENT AND TRADEMARK OFFICE
CERTIFICATE OF CORRECTION

PATENT NO. : 6,783,640 B2
DATED : August 31, 2004
INVENTOR(S) : Toshihiro Yamashita et al.

It is certified that error appears in the above-identified patent and that said Letters Patent is hereby corrected as shown below:

Title page,
Item [56], References Cited, OTHER PUBLICATIONS, after "S. Schiller, et al.:" "W b Coating" " should read -- Web Coating" --.
Item [75], Inventors, "Toshihiro Yamashita, Tokyo (JP); Hiroshi Echizen, Tokyo (JP); Yasuyoshi Takai, Tokyo (JP); Hidetoshi Tsuzuki, Tokyo (JP)" should read -- Toshihiro Yamashita, Kyoto (JP); Hiroshi Echizen, Nara (JP); Yasuyoshi Takai, Nara (JP); Hidetoshi Tsuzuki, Kanagawa (JP) --.

Drawings,
SHEET 8, Figure 22, "SPUTIERING" should read -- SPUTTERING --.

Column 1,
Line 50, "Komdorfer," should read -- Komdorfer, --.

Column 2,
Line 17, "actual-emission" should read -- actual emission --.

Column 3,
Line 10, "an" should read -- a --.

Column 5,
Line 59, "increased m," should read -- increased --; and
Line 65, "control, in" should read -- control, --.

Column 6,
Line 43, "any" should read -- an --; and
Line 51, "optically." should read -- optically --.

Column 7,
Line 66, "16." should read -- 16. --.

Column 8,
Line 55, "sheath-heaters" should read -- sheath heaters --.

UNITED STATES PATENT AND TRADEMARK OFFICE
CERTIFICATE OF CORRECTION

PATENT NO. : 6,783,640 B2
DATED : August 31, 2004
INVENTOR(S) : Toshihiro Yamashita et al.

It is certified that error appears in the above-identified patent and that said Letters Patent is hereby corrected as shown below:

Column 10,
Line 14, "AS" should read -- As --.

Column 11,
Line 26, "2 flow" should read -- $O_2$ flow--;
Line 44, "Qi gas" should read -- $O_2$ gas--; and
Line 51, "shown" should read -- shown in --.

Column 12,
Line 13, "forming-rate." should read -- forming rate --; and
Line 19, "a-phenomenon" should read -- a phenomenon --.

Signed and Sealed this

Fourteenth Day of December, 2004

JON W. DUDAS
*Director of the United States Patent and Trademark Office*